(12) United States Patent (10) Patent No.: US 12,695,286 B2
Esler et al. (45) Date of Patent: Jul. 28, 2026

(54) HIGH POWER BIDIRECTIONAL SOLID-STATE CIRCUIT BREAKER

(71) Applicant: General Electric Company, Schenectady, NY (US)

(72) Inventors: David Richard Esler, Gloversville, NY (US); Satish Prabhakaran, Colonie, NY (US); Ren Xie, Niskayuna, NY (US); Omer Gundogmus, Niskayuna, NY (US); Liqiang Yang, Pompano Beach, FL (US); Constantinos Minas, Slingerlands, NY (US)

(73) Assignee: General Electric Company, Schenectady, NY (US)

( * ) Notice: Subject to any disclaimer, the term of this patent is extended or adjusted under 35 U.S.C. 154(b) by 128 days.

(21) Appl. No.: 18/135,497

(22) Filed: Apr. 17, 2023

(65) Prior Publication Data

US 2024/0348036 A1 Oct. 17, 2024

(51) Int. Cl.
| | |
|---|---|
| *H02H 3/00* | (2006.01) |
| *H02H 1/00* | (2006.01) |
| *H02H 3/08* | (2006.01) |
| *H03K 17/687* | (2006.01) |

(52) U.S. Cl.
CPC ............ *H02H 3/08* (2013.01); *H02H 1/0007* (2013.01); *H03K 17/687* (2013.01)

(58) Field of Classification Search
CPC ....... H02H 3/08; H02H 1/0007; H03K 17/687
USPC .......................................................... 361/87
See application file for complete search history.

(56) References Cited

U.S. PATENT DOCUMENTS

| | | | |
|---|---|---|---|
| 4,300,181 | A | 11/1981 | Premerlani |
| 5,339,210 | A | 8/1994 | Howell |
| 8,837,093 | B2 | 9/2014 | Panousis et al. |
| 8,891,209 | B2 | 11/2014 | Hfner et al. |
| 9,350,250 | B2 | 5/2016 | Whitehouse |
| 9,479,061 | B2 | 10/2016 | Trainer et al. |

(Continued)

FOREIGN PATENT DOCUMENTS

| | | |
|---|---|---|
| EP | 3391498 B1 | 10/2019 |
| GB | 2542789 A | 4/2017 |

OTHER PUBLICATIONS

"Achieve Bidirectional Control and Protection Through Back-to-Back Connected eFuse Devices", available at: https://www.ti.com/lit/an/slva948/slva948.pdf?ts=1673979843525.

(Continued)

*Primary Examiner* — Crystal L Hammond
*Assistant Examiner* — Lucy M Thomas
(74) *Attorney, Agent, or Firm* — Smith, Gambrell & Russell, LLP

(57) ABSTRACT

A solid-state circuit breaker may include power modules, gate drives, a current sensor, and a controller. Each power module may include two back-to-back MOSFETs with body diodes. The MOSFETs may have opposite orientations and a common source connection within the power module. The current sensor may detect current, and the controller may determine whether the current exceeds a predetermined threshold. When the current exceeds the predetermined threshold, the controller may transmit a signal to each gate drive to cause each gate drive to output a signal to the back-to-back MOSFETs such that the electrical current through the solid-state circuit breaker is blocked in both directions.

22 Claims, 3 Drawing Sheets

(56)             References Cited

U.S. PATENT DOCUMENTS

| | | | |
|---|---|---|---|
| 2008/0289853 A1* | 11/2008 | Sakai | H05K 1/141 |
| | | | 29/827 |
| 2014/0009189 A1* | 1/2014 | Mauder | H03K 17/687 |
| | | | 327/109 |
| 2015/0116881 A1 | 4/2015 | Burnett et al. | |
| 2015/0131189 A1 | 5/2015 | Davidson et al. | |
| 2016/0049876 A1* | 2/2016 | Lee | H02M 3/335 |
| | | | 363/20 |
| 2016/0322809 A1 | 11/2016 | Wang et al. | |
| 2019/0181755 A1* | 6/2019 | Swamy | H02M 3/1584 |
| 2019/0198430 A1* | 6/2019 | Takano | H01L 21/4853 |
| 2020/0395748 A1 | 12/2020 | Miller et al. | |
| 2021/0066013 A1 | 3/2021 | Kumar et al. | |
| 2021/0104453 A1* | 4/2021 | Kinoshita | H01L 24/49 |
| 2021/0344187 A1* | 11/2021 | Namuduri | H02H 3/0935 |
| 2022/0094350 A1 | 3/2022 | Sterna et al. | |
| 2022/0123745 A1* | 4/2022 | Cairoli | H03K 17/76 |
| 2022/0182051 A1* | 6/2022 | Handt | G01R 27/2611 |
| 2022/0416681 A1 | 12/2022 | Telefus | |
| 2023/0032783 A1* | 2/2023 | Kameda | A61N 1/025 |

OTHER PUBLICATIONS

Urciuoli, "Evaluation of SiC VJFET Devices for Scalable Solid-State Circuit Breakers", available at https://apps.dtic.mil/sti/pdfs/ADA481819.pdf.

Extended European Search Report for Application No. 24155887.3 dated Jun. 26, 2024 (12 pages).

Fisher et al. "High Frequency, Low Cost, Power Packaging Using Thin Film Power Overlay Technology", APEC Applied Power Electronics Conference and Exposition, XX, XX, vol. 1, Jan. 1, 1995, pp. 12-17, XP000561606, DOI: 10.1109/APEC.1995.468955 * p. 14; figure 3.

* cited by examiner

HIGH POWER BIDIRECTIONAL SOLID-STATE CIRCUIT BREAKER

FIELD

The present disclosure relates to solid-state circuit breakers, and more specifically, to a high power bidirectional solid-state circuit breaker.

BACKGROUND

Aircraft and other vehicles utilize power modules to operate various electrical components. These power modules provide high voltages and currents to the electrical components. However, if a short circuit occurs in a circuit utilizing a power module, the electrical components may become damaged. Accordingly, there is a need for an improved high power bidirectional solid-state circuit breaker.

DETAILED DESCRIPTION

The present disclosure generally relates to a high power bidirectional solid-state circuit breaker. Electrical systems used in aircraft and other vehicles utilize large voltage and currents (e.g., potentially hundreds of Volts and/or hundreds of Amps). Thus, any electrical short in such a system can easily damage equipment. Accordingly, it is desirable to use a circuit breaker in such a system that can handle high voltages and current and that can quickly activate in the event of a short circuit in order to prevent equipment from being damaged.

In embodiments disclosed herein, a high power bidirectional solid-state circuit breaker is disclosed. In particular, a solid-state circuit breaker includes one or more power modules that each include two metal-oxide-semiconductor field-effect transistors (MOSFETs) arranged in a back-to-back configuration. That is, a pair of MOSFETs are arranged in series, with each MOSFET being oriented in a different direction. A current sensor detects when a current exceeds a threshold level (e.g., an unsafe level that may be caused by a short-circuit). When the current sensor detects a current exceeding the threshold level, a control circuit is triggered and sends a signal to a gate drive, which then transmits a signal to shut off each of the MOSFETs, thereby preventing current from flowing through them. Because the two MOSFETs are arranged with opposite orientation, current is prevented from flowing in either direction, thereby making the solid-state circuit breaker bidirectional. A damping circuit may prevent voltage spikes from exceeding voltage limits of the MOSFETs. The solid-state circuit breaker may include a plurality of power modules in parallel, as disclosed herein.

Figure 1:
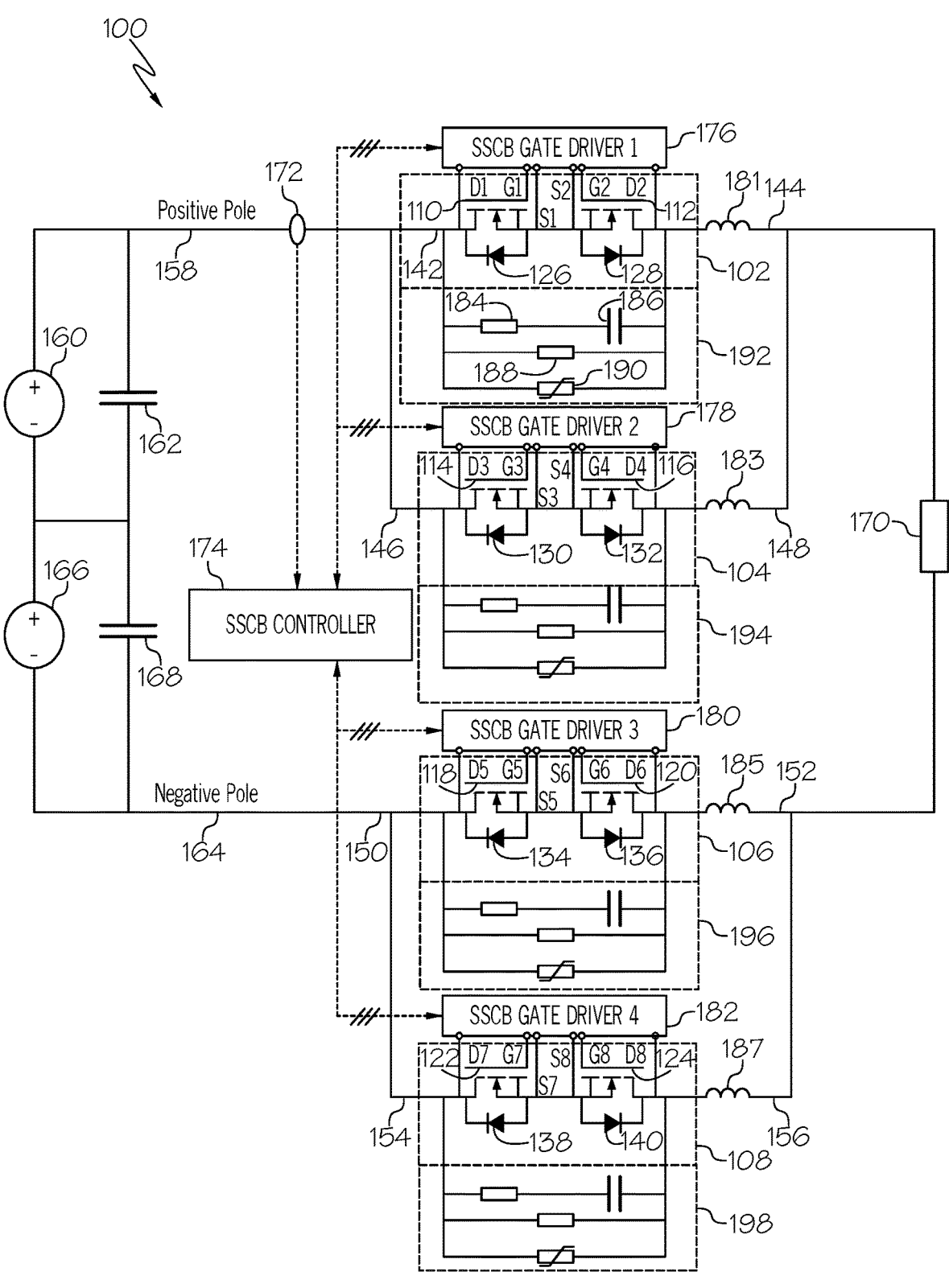
FIG. 1 schematically depicts an example solid-state circuit breaker, according to one or more embodiments shown and described herein.

Turning now to FIG. 1, an example solid-state circuit breaker 100 is shown. In the example of FIG. 1, the circuit breaker 100 comprises power modules 102, 104, 106, and 108. While the circuit breaker 100 of FIG. 1 comprises four power modules, it should be understood that in other examples, the circuit breaker 100 may include any number of power modules connected in parallel. The power modules 102, 104, 106, 108 are configured to allow current to flow through them during normal operation, and to prevent current from flowing through them when the current exceeds a threshold value, as described in further detail below.

Each of the power modules 102, 104, 106, 108 includes a pair of MOSFETs oriented in opposite directions. In particular, the power module 102 includes MOSFETs 110 and 112, the power module 104 includes MOSFETs 114 and 116, the power module 106 includes MOSFETs 118 and 120, and the power module 108 includes MOSFETs 122 and 124. Including two MOSFETs within a single power module reduces the weight of the circuit breaker 100 compared to systems utilizing two MOSFETs in two separate power modules. In addition, because two MOSFETs are contained within one power module, a single cold plate may be used to cool both MOSFETs. In some examples, each of the MOSFETs 110, 112 in the power module 102 may be replaced with a plurality of MOSFETs in parallel. Similarly, any of the MOSFETs 114, 116, 118, 120, 122, 124 may be replaced with a plurality of MOSFETs in parallel.

The MOSFET 110 includes a gate G1, a source S1, and a drain D1, and the MOSFET 112 includes a gate G2, a source S2, and a drain D2. Similarly, each of the MOSFETs 114, 116, 118, 120, 122, and 124 include a gate, a source, and a drain. Each of the MOSFETs 110, 112, 114, 116, 118, 120, 122, 124 includes a respective body diode 126, 128, 130, 132, 134, 136, 138, 140. In the example of FIG. 1, the MOSFETs 110, 112, 114, 116, 118, 120, 122, 124 are constructed from silicon carbide. However, in other examples, the MOSFETs may be constructed from other materials.

The power module 102 comprises a first electrical terminal 142 and a second electrical terminal 144. Similarly, the power modules 104, 106, 108 comprise respective first electrical terminals 146, 150 and 154, and respective second electrical terminals 148, 152, and 156. The terminals 142, 144, 146, 148, 150, 152, 154, and 156 are configured to be connected to external circuit elements. In the example of FIG. 1, the first terminals 142 and 146 are connected to positive pole 158, which is connected to voltage source 160, which is in parallel with capacitor 162. In the example of FIG. 1, the first terminals 150 and 154 are connected to negative pole 164, which is connected to voltage source 166, which is in parallel with capacitor 168. The cathodes of the body diodes 126, 130, 134, and 138 are connected to the respective first terminals 142, 146, 150, 154. The cathodes of the body diodes 128, 132, 136, 140 are connected to the respective second terminals 144, 148, 152, 156.

In the example of FIG. 1, each of the second terminals 144, 148, 152, 156 is connected to load 170. However, in other examples, the terminals of the MOSFETs may be connected to any other circuit elements. The circuit breaker 100 in the illustrated example is configured to protect the circuit elements connected to the terminals of the MOSFETs in the event of a short circuit and/or voltage surge, as disclosed herein.

In the example of FIG. 1, the first terminal 142 of the power module 102 is generously spaced from the second terminal 144 of the power module 102. In particular, in the illustrated example, the distance between the first terminal 142 and the second terminal 144 is greater than 95 mm. The terminals of the power modules 104, 106, 108 are similarly spaced. The generous spacing between the first and second terminals 142, 144 allows for more spacing of the other components of the circuit breaker 100 (e.g., between the terminals and the pins of the gate drives) in order to prevent arc voltages between the components when operating in high voltage applications.

In the example of FIG. 1, a current sensor 172 detects electrical current in the circuit breaker 100. In the example of FIG. 1, the current sensor 172 detects current in the path of first terminal 142. However, it should be understood that in other examples the current sensor 172 may detect current in the path of the first terminals 146, 150, 154 and/or the second terminals 144, 148, 152, 156 instead of or in addition to the current in the path of first terminal 142.

The current sensor 172 transmits the detected current to a controller 174. The controller 174 may detect whether the current detected by the current sensor 172 is above a predetermined threshold. The threshold may be set at a level above which may indicate a short circuit or other electrical problem has occurred. When the controller 174 determines that the current detected by the current sensor 172 is above the predetermined threshold, the controller 174 may transmit a signal to gate drives 176, 178, 180, and 182, to shut off the MOSFETs 110, 112, 114, 116, 118, 120, 122, 124, as disclosed herein. In some examples, the controller 174 may receive other data from various components of the circuit breaker 100 such as temperatures of components. In these examples, the controller 174 may transmit a signal to shut of the MOSFETs based on this received data (e.g., upon determination that a temperature of a component exceeds a predetermined threshold).

In the example of FIG. 1, each of the gate drives 176, 178, 180, 182 is associated with a respective power module 102, 104, 106, 108. In particular, the gate drive 176 is connected to the gate G1, the source S1, and the drain D1 of the MOSFET 110, and is also connected to the gate G2, the source S2, and the drain D2 of the MOSFET 112. In addition, the drain D1 of the MOSFET 110 is connected to the first terminal 142, and the drain D2 of the MOSFET 112 is connected to the second terminal 144. The source S1 of the MOSFET 110 and the source S2 of the MOSFET 112 are connected to each other. The gate drives 178, 180, 182 are connected to the gate, source, and drain of each of the MOSFETs of the respective power modules 104, 106, 108 in a similar manner.

During normal operation, current is able to pass through each of the MOSFETs of the power modules 102, 104, 106, 108, respectively. As such, during normal operation, current can flow from the voltage sources 160 and 166 to the load 170. However, when the controller 174 determines that the current detected by the current sensor 172 exceeds the predetermined threshold, the controller 174 sends a signal to the gate drives 176, 178, 180, 182 to cause each of the gate drives to output a voltage with respect to the gate and source of each of the MOSFETs 110, 112, 114, 116, 118, 120, 122, 124 to turn off the MOSFETs, such that current is no longer able to pass through the MOSFETs. As such, the MOSFETs of the power modules 102, 104, 106, 108 act as a circuit breaker. Particularly, because the MOSFETs of the power modules are oriented back to back, the power modules 102, 104, 106, 108 act as a bi-directional circuit breaker. That is, the power modules 102, 104, 106, 108 may act as a circuit breaker for current traveling in either direction.

The circuit breaker 100 of FIG. 1 further includes damping circuits 192, 194, 196, and 198. The damping circuits 192, 194, 196, 198 may also be referred to as voltage suppression circuits or snubber circuits. The damping circuits 192, 194, 196, 198 are associated with power modules 102, 104, 106, 108, respectively. When the gate drives 176, 178, 180, 182 switch off the MOSFETs within the power modules 102, 104, 106, 108, a voltage surge may occur, which can be damaging to the electrical equipment. As such, the damping circuits 192, 194, 196, 198 may suppress these voltage spikes and absorb the current by allowing current to flow through the damping circuits during a voltage surge, which protects the electrical equipment from damage. The damping circuit 192 includes a first resistor 184, a capacitor 186, a second resistor 188, and a metal oxide varistor (MOV) 190. In some examples, the MOV 190 may be replaced with one or more transient voltage suppression diodes, one or more gas discharge tubes, or a combination thereof. The damping circuits 194, 196, and 198 may be constructed in a similar manner as the damping circuit 192. In the illustrated example, each damping circuit is connected to one power module. However, in some examples, one damping circuit may be connected to more than one power module.

In some examples, the circuit breaker 100 may include balancing inductors 181, 183, 185, and 187. The balancing inductors may be included to balance the current between the power modules 102, 104, 106, 108. In the example of FIG. 1, the balancing inductors 181, 183, 185, 187 are connected to the second terminals 144, 148, 152, 156, respectively, of the power modules 102, 104, 106, 108. However, in other examples, one or more of the balancing inductors 181, 183, 185, 187 may be connected to the first terminals 142, 146, 150, 154 of the power modules 102, 104, 106, 108, rather than the second terminals.

The circuit breaker 100 of FIG. 1 is scalable. That is, any number of additional power modules may be added in parallel to the power modules 102, 104, 106, 108 of FIG. 1. Adding additional power modules may allow the circuit breaker 100 to handle higher voltages. Thus, the circuit breaker 100 may be utilized in high voltage applications, such as in aircraft or other vehicle systems.

Figure 2:
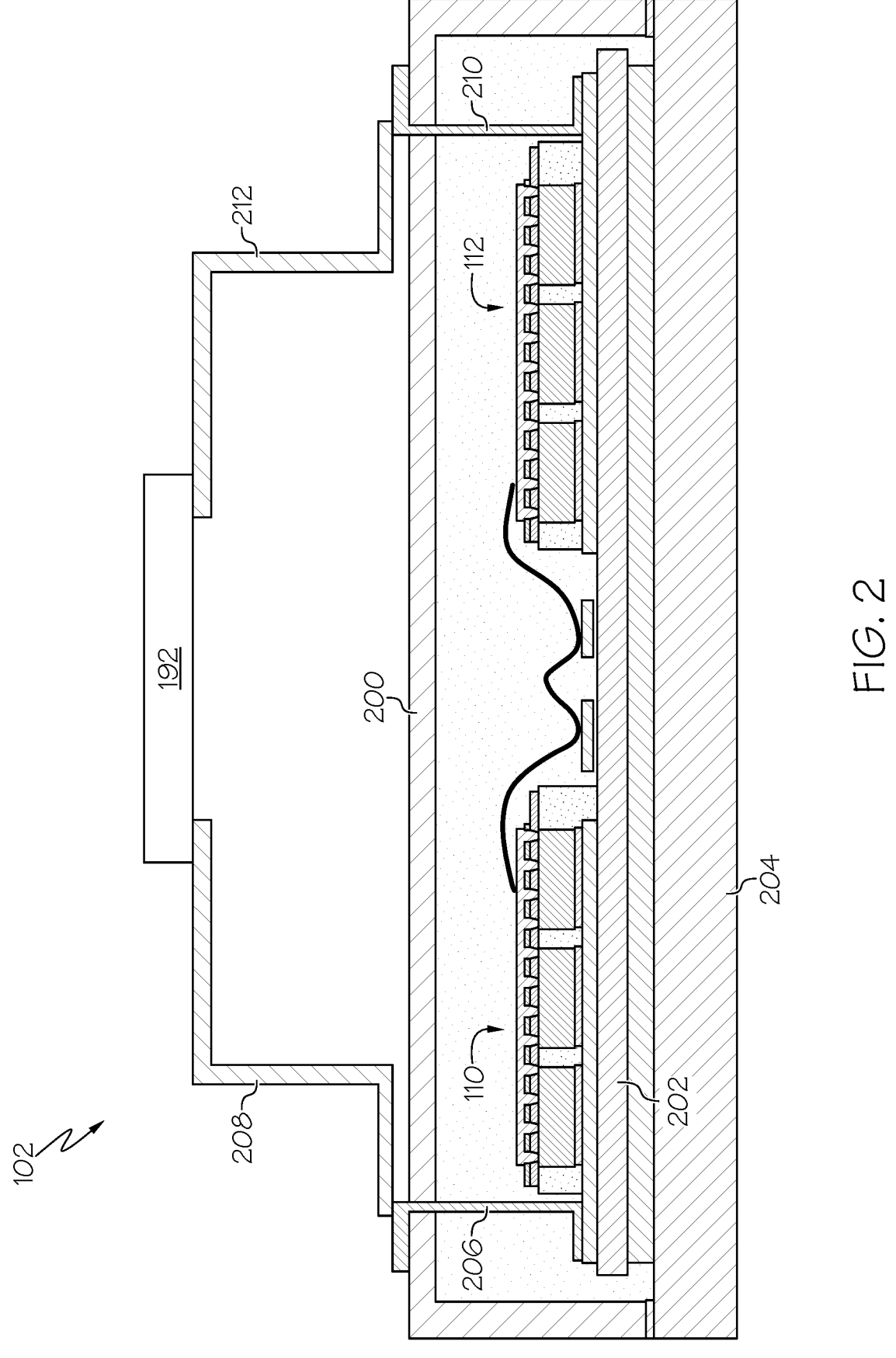
FIG. 2 schematically depicts a side view of the solid-state circuit breaker of FIG. 1, according to one or more embodiments shown and described herein.

Turning now to FIG. 2, a side view of the example power module 102 is shown. In the example of FIG. 2, the MOSFETs 110 and 112 comprise three separate MOSFET components in series. However, in other examples, the MOSFETs 110, 112 may comprise a single MOSFET component, or any number of multiple MOSFET components in series. In the example of FIG. 2, the MOSFETS 110, 112 are contained within a frame or lid 200. In addition, the MOSFETs 110, 112 are positioned on top of a ceramic metal substrate 202, which is positioned on top of a baseplate 204.

In the example of FIG. 2, the power module 102 further comprises busbars 206, 208, 210, and 212. A first end of the busbar 206 is connected to the MOSFET 110 and a second end of the busbar 206 is connected to the frame 200. A first end of the busbar 208 is connected to the frame 200 and a second end of the busbar 208 is connected to the damping circuit 192. Similarly, a first end of the busbar 210 is connected to the MOSFET 112, a second end of the busbar 210 is connected to the frame 200, a first end of the busbar 212 is connected to the frame 200, and a second end of the busbar 212 is connected to the damping circuit 192. The power module 102 is filled with a dielectric gel inside of the frame 200.

In the example of FIG. 2, the busbars 206, 208, 210, 212 have flat and wide structures. The busbars 206, 208, 210, 212 provide a low loop inductance for the power module 102. In the illustrated example, the power module 102 has an inductance of less than 200 nanohenry (nH). In addition, in the illustrated example, the power module 102, as well as the other power modules of the circuit breaker 100, use power overlay technology. This also reduces the inductance of the power modules and the circuit breaker 100. Furthermore, because the MOSFETs 110 and 112 are within the single power module 102, the MOSFETs 110, 112 have a lower inductance than the MOSFETs 110, 112 would have if each of the MOSFETs 110, 112 were placed in separate power modules.

Figure 3:
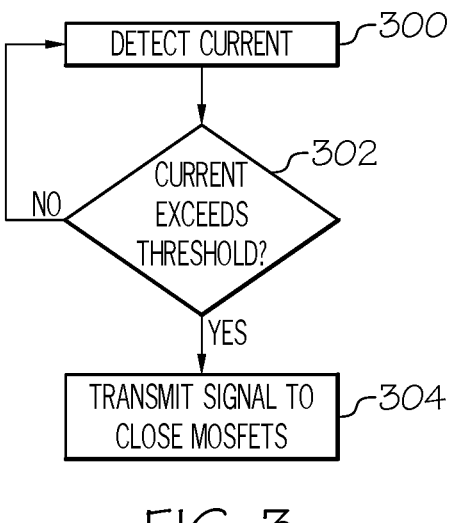
FIG. 3 shows a flowchart of a method for operating the solid-state circuit breaker of FIGS. 1 and 2, according to one or more embodiments shown and described herein.

FIG. 3 depicts a flowchart of a method for operating the circuit breaker 100 of FIGS. 1 and 2. At step 300, the current sensor 172 detects a current in the circuit breaker 100. After detecting the current, the current sensor 172 transmits the detected current to the controller 174. For example, the current sensor 172 may detect the amount of Amps of current flowing through the circuit breaker 100, and transmit this value to the controller 174.

At step 302, the controller 174 determines whether the current detected by the current sensor 172 exceeds a predetermined threshold. If the controller 174 determines that the detected current does not exceed the predetermined threshold (NO at step 302), then control returns to step 300. If the controller 174 determines that the detected current does exceeds the predetermined threshold (YES at step 304), then control passes to step 304. For example, the controller 174 may compare the detected current to the predetermined threshold value to determine whether an excess current is present in the circuit breaker 100.

At step 304, upon determination that the current detected by the current sensor 172 exceeds the predetermined threshold, the controller 174 transmit a signal to the gate drives 176, 178, 180, 182 to cause the gate drives to close the MOSFETs 110, 112, 114, 116, 118, 120, 122, 124. In particular, the signal transmits to the gate drives 176, 176, 180, 182 causes the gate drives to apply a voltage to the MOSFETs 110, 112, 114, 116, 118, 120, 122, 124 such that current can no longer pass through the MOSFETs. As such, when a short circuit occurs and current exceeds the predetermined threshold, the circuit breaker 100 blocks current from flowing, thereby protecting electrical equipment from damage due to excessive current levels.

It should now be understood that the devices, systems, and methods described herein provide a high power bidirectional solid-state circuit breaker. By arranging two MOSFETs within a power module in a back-to-back configuration, a high power bidirectional solid-state circuit breaker can be achieved. The disclosed circuit breaker features high power density, a fast response time, high efficiency, and requires little maintenance. Furthermore, the disclosed circuit breaker can handle many cycles (potentially thousands of cycles). Utilizing silicon carbide MOSFETs lowers steady state losses. In addition, a damping circuit protects against damage from voltage spikes when the MOSFETs are switched.

The back-to-back MOSFET configuration provides low electrical resistance, resulting in lower heat generation and less cooling demand. In addition, the back-to-back MOSFETs can be cooled by a single cold plate, resulting in less mass and higher power density. The lower heat generation enables a more uniform temperature distribution within the module and higher efficiency. The back-to-back MOSFET configuration within a power module also allows for generous spacing between the terminals of the power module. The disclosed circuit breaker is also scalable, such that additional power modules and associated electrical components can be added in parallel to increase the current capacity of the circuit breaker. Furthermore, the disclosed solid-state circuit breaker can handle up to at least 1000 V and 1000 A, and potentially even higher voltages and currents.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

Further aspects of the disclosure are provided by the subject matter of the following clauses.

A solid-state circuit breaker comprising: one or more power modules; one or more gate drives, each gate drive associated with a power module; a current sensor; and a controller; each power module of the one or more power modules having a first terminal electrically connected to a first external circuit element and a second terminal electrically connected to a second external circuit element, the power module comprising: a first metal oxide field effect transistor (MOSFET) oriented in a first direction and comprising a first body diode having a cathode electrically connected to the first terminal; a second MOSFET oriented in a second direction opposite the first direction and comprising a second body diode having a cathode electrically connected to the second terminal; wherein a drain of the first MOSFET is electrically connected to the first terminal; wherein a drain of the second MOSFET is electrically connected to the second terminal; and wherein a source of the first MOSFET and a source of the second MOSFET are electrically connected to each other within the power module; the current sensor being electrically connected to the controller and configured to detect an electrical current in a path of the first terminal or the second terminal; the controller being configured to determine whether the electrical current in the path of the first terminal or the second terminal is greater than a first predetermined threshold based on a signal from the current sensor; each gate drive of the one or more gate drives being electrically connected to the controller, the drain of the first MOSFET, the drain of the second MOSFET, the source of the first MOSFET, the source of the second MOSFET, a gate of the first MOSFET, and a gate of the second MOSFET; wherein the controller is configured to, upon determination that the electrical current in the path of the first terminal or the second terminal is greater than the first predetermined threshold, transmit a signal to each gate drive of the one or more gate drives to cause each gate drive of the one or more gate drives to output a signal to a corresponding first MOSFET and a corresponding second MOSFET such that the electrical current through the solid-state circuit breaker is blocked in both directions.

The solid-state circuit breaker of any preceding clause, wherein a distance between the first terminal and the second terminal is greater than 95 mm.

The solid-state circuit breaker of any preceding clause, comprising power overlay technology.

The solid-state circuit breaker of any preceding clause, wherein the MOSFETs are constructed from silicon carbide.

The solid-state circuit breaker of any preceding clause, further comprising a cold plate coupled to the power module.

The solid-state circuit breaker of any preceding clause, further comprising at least a first power module in parallel with a second power module.

The solid-state circuit breaker of any preceding clause, further comprising a plurality of balancing inductors, each balancing inductor is in series with a first MOSFET and a second MOSFET.

The solid-state circuit breaker of any preceding clause, further comprising a plurality of damping circuits, wherein each damping circuit is in parallel with a corresponding power module.

The solid-state circuit breaker of any preceding clause, wherein each damping circuit comprises a metal oxide varistor in parallel with a first resistor and a capacitor.

The solid-state circuit breaker of any preceding clause, wherein each damping circuit further comprises a second resistor in parallel with the metal oxide varistor.

The solid-state circuit breaker of any preceding clause, further comprising one or more first power modules having the first terminal electrically connected to a first pole and one or more second power modules having the first terminal electrically connected to a second pole.

The solid-state circuit breaker of any preceding clause, further comprising a first busbar and a second busbar; a first end of the first busbar is connected to one of the one or more power modules; a second end of the first busbar is connected to a frame enclosing the one of the one or more power modules; a first end of the second busbar is connected to the frame; and a second end of the second busbar is connected to the damping circuit corresponding to the one of the one or more power modules.

A circuit comprising at least one voltage source; an electrical load; and a solid-state circuit breaker comprising: one or more power modules; one or more gate drives, each gate drive associated with a power module; a current sensor; and a controller; each power module of the one or more power modules having a first terminal electrically connected to the at least one voltage source and a second terminal electrically connected to the electrical load, the power module comprising: a first metal oxide field effect transistor (MOSFET) oriented in a first direction and comprising a first body diode having a cathode electrically connected to the first terminal; a second MOSFET oriented in a second direction opposite the first direction and comprising a second body diode having a cathode electrically connected to the second terminal; wherein a drain of the first MOSFET is electrically connected to the first terminal; wherein a drain of the second MOSFET is electrically connected to the second terminal; and wherein a source of the first MOSFET and a source of the second MOSFET are electrically connected to each other within the power module; the current sensor being electrically connected to the controller and configured to detect an electrical current in a path of the first terminal or the second terminal; the controller being configured to determine whether the electrical current in the path of the first terminal or the second terminal is greater than a first predetermined threshold based on a signal from the current sensor; each gate drive of the one or more gate drives being electrically connected to the controller, the drain of the first MOSFET, the drain of the second MOSFET, the source of the first MOSFET, the source of the second MOSFET, a gate of the first MOSFET, and a gate of the second MOSFET; wherein the controller is configured to, upon determination that the electrical current in the path of the first terminal or the second terminal is greater than the first predetermined threshold, transmit a signal to each gate drive of the one or more gate drives to cause each gate drive of the one or more gate drives to output a signal to a corresponding first MOSFET and a corresponding second MOSFET such that the electrical current through the solid-state circuit breaker is blocked in both directions.

A circuit of any preceding clause, wherein the solid-state circuit breaker further comprises at least a first power module in parallel with a second power module.

A circuit of any preceding clause, wherein the solid-state circuit breaker further comprises a plurality of balancing inductors, each balancing inductor is in series with a first MOSFET and a second MOSFET.

A circuit of any preceding clause, wherein the solid-state circuit breaker further comprises a plurality of damping circuits, wherein each damping circuit is in parallel with a corresponding power module.

A circuit of any preceding clause, wherein each damping circuit comprises a metal oxide varistor in parallel with a first resistor and a capacitor.

A circuit of any preceding clause, wherein each damping circuit further comprises a second resistor in parallel with the metal oxide varistor.

A circuit of any preceding clause, wherein the solid-state circuit breaker further comprises one or more first power modules having the first terminal electrically connected to a first pole and one or more second power modules having the first terminal electrically connected to a second pole.

A circuit of any preceding clause, wherein the solid-state circuit breaker further comprises a first busbar and a second busbar; a first end of the first busbar is connected to one of the one or more power modules; a second end of the first busbar is connected to a frame enclosing the one of the one or more power modules; a first end of the second busbar is connected to the frame; and a second end of the second busbar is connected to the damping circuit corresponding to the one of the one or more power modules.

What is claimed is:

1. A solid-state circuit breaker comprising:
a power module;
a gate drive associated with the power module;
a current sensor; and
a controller;
the power module having a first terminal electrically connected to a first external circuit element and a second terminal electrically connected to a second external circuit element, the power module comprising:
a first metal oxide field effect transistor (MOSFET) oriented in a first direction and comprising a first body diode having a cathode electrically connected to the first terminal;
a second MOSFET oriented in a second direction opposite the first direction and comprising a second body diode having a cathode electrically connected to the second terminal;
wherein a drain of the first MOSFET is electrically connected directly to the first terminal;
wherein a drain of the second MOSFET is electrically connected directly to the second terminal; and
wherein the power module comprises a frame, the first MOSFET and the second MOSFET being contained within the frame with a source of the first MOSFET and a source of the second MOSFET electrically connected to each other within the frame;
the current sensor being electrically connected to the controller and configured to detect an electrical current in a path of the first terminal or the second terminal;
the controller being configured to determine whether the electrical current in the path of the first terminal or the second terminal is greater than a first predetermined threshold based on a signal from the current sensor;

the gate drive being electrically connected directly to the controller, the drain of the first MOSFET, the drain of the second MOSFET, the source of the first MOSFET, the source of the second MOSFET, a gate of the first MOSFET, and a gate of the second MOSFET;

wherein the gate drive is connected to the power module by one or more dedicated electrical connections;

wherein the controller is configured to, upon determination that the electrical current in the path of the first terminal or the second terminal is greater than the first predetermined threshold, transmit a signal to the gate drive to cause the gate drive to output a signal with respect to the gate and the source of the first MOSFET and with respect to the gate and the source of the second MOSFET such that the electrical current through the solid-state circuit breaker is blocked in both directions.

2. The solid-state circuit breaker of claim 1, wherein a distance between the first terminal and the second terminal is greater than 95 millimeters.

3. The solid-state circuit breaker of claim 1, comprising power overlay technology.

4. The solid-state circuit breaker of claim 1, wherein the first and second MOSFETs are constructed from silicon carbide.

5. The solid-state circuit breaker of claim 1, further comprising a cold plate coupled to the power module.

6. The solid-state circuit breaker of claim 1, wherein the power module is a first power module, and further comprising a second power module in parallel with the power module.

7. The solid-state circuit breaker of claim 1, further comprising a balancing inductor in series with the first MOSFET and the second MOSFET.

8. The solid-state circuit breaker of claim 1, further comprising a damping circuit in parallel with the power module, the damping circuit being positioned outside the frame.

9. The solid-state circuit breaker of claim 8, wherein the damping circuit comprises a metal oxide varistor in parallel with a first resistor and a capacitor.

10. The solid-state circuit breaker of claim 9, wherein the damping circuit further comprises a second resistor in parallel with the metal oxide varistor.

11. The solid-state circuit breaker of claim 1, wherein the power module is a first power module, and further comprising a second power module, wherein the first terminal of the first power module is electrically connected to a first pole and a first terminal of the second power module is electrically connected to a second pole.

12. The solid-state circuit breaker of claim 8, further comprising a first busbar and a second busbar, the first busbar and the second busbar being low inductance busbars, wherein a first end of the first busbar is connected to a substrate within the frame;

a second end of the first busbar is connected to the frame;

a first end of the second busbar is connected to the frame or the second end of the first busbar; and a second end of the second busbar is connected to the damping circuit.

13. A circuit comprising:

the solid-state circuit breaker of claim 1, wherein the first external circuit element is at least one voltage source; and the second external circuit element is an electrical load.

14. The circuit of claim 13, wherein the power module is a first power module, and wherein the solid-state circuit breaker further comprises a second power module in parallel with the first power module.

15. The circuit of claim 13, wherein the solid-state circuit breaker further comprises a balancing inductor in series with the first MOSFET and the second MOSFET.

16. The circuit of claim 13, wherein the solid-state circuit breaker further comprises a damping circuit, wherein the damping circuit is in parallel with the power module.

17. The circuit of claim 16, wherein the damping circuit comprises a metal oxide varistor in parallel with a first resistor and a capacitor.

18. The circuit of claim 17, wherein the damping circuit further comprises a second resistor in parallel with the metal oxide varistor.

19. The circuit of claim 13, wherein the power module is a first power module, and wherein the solid-state circuit breaker further comprises a second power module, wherein the first terminal of the first power module is electrically connected to a first pole and a first terminal of the second power module is electrically connected to a second pole.

20. The circuit of claim 16, wherein the solid-state circuit breaker further comprises a first busbar and a second busbar;

a first end of the first busbar is connected to the power module;

a second end of the first busbar is connected to a frame enclosing the power module;

a first end of the second busbar is connected to the frame; and a second end of the second busbar is connected to the damping circuit.

21. The solid-state circuit breaker according to claim 1, wherein the current sensor is electrically connected directly to the controller.

22. The solid-state circuit breaker according to claim 1, wherein the frame is filled with a dielectric gel.

* * * * *